United States Patent [19]
McDonough et al.
[11] 3,921,884
[45] Nov. 25, 1975

[54] BEAM LEAD TOOL

[75] Inventors: Thomas L. McDonough, Nahant; Martin M. McDonough, Swampscott, both of Mass.

[73] Assignee: Calx, Inc., Lynn, Mass.

[22] Filed: Sept. 28, 1973

[21] Appl. No.: 401,870

[52] U.S. Cl. .................... 228/44.1; 228/1; 228/3.1; 228/6

[51] Int. Cl.² .................................. B23K 19/04

[58] Field of Search ............ 228/3, 4, 44, 6, 54, 55, 228/1

[56] References Cited

UNITED STATES PATENTS

| | | | |
|---|---|---|---|
| 3,400,448 | 9/1968 | Helda et al. | 228/3 X |
| 3,458,102 | 7/1969 | Zanger et al. | 228/3 |
| 3,472,443 | 10/1969 | Holyl et al. | 228/3 |
| 3,575,333 | 4/1971 | Kulicke, Jr. et al. | 228/4 X |
| 3,695,502 | 10/1972 | Gaiser | 228/4 |
| 3,700,155 | 10/1972 | Hermans | 228/4 |

*Primary Examiner*—Ronald J. Shore
*Attorney, Agent, or Firm*—Wolf, Greenfield & Sacks

[57] ABSTRACT

The beam lead tool is for picking up and bonding semi-conductor wafers or dice to a substrate and includes an accommodating recess in which the wafer is positioned and a suction duct for permitting the wafer to be retained in the tool. The tool is formed as a tip at one end having a peripheral beam lead contacting surface that is formed by a grinding and lapping process wherein a radius or other curvature is defined along the inner facing edges defined by the contacting surface. The surface is first ground to a flatness and is then lapped by a vibratory motion against a resilient stationary pad such as a chamois impregnated with an abrasive material such as a conventional diamond paste.

13 Claims, 11 Drawing Figures

BEAM LEAD TOOL

FIELD OF THE INVENTION

The present invention relates in general to a beam lead bonding tool and, more particularly, to an improved beam lead bonding tool and the process of manufacture thereof. The tool usually forms a part of a larger semi-conductor bonding apparatus.

BACKGROUND OF THE INVENTION

A typical semi-conductor wafer positioning and beam lead bonding tool is provided with a flat peripheral lower surface that contacts the beam leads and is used for bonding leads to like conductor leads associated with a substrate. It has been found that this flat surface, which is defined by a sharp inner edge, in contacting the beam lead, causes the lead to be non-uniformly depressed thereby forming a weakened area of reduced thickness in the beam lead where this inner edge contacts the beam lead and adjacent the edge of the wafer.

Accordingly, to overcome this problem of forming a weakened area, it is an object of the present invention to provide a beam lead tool having a peripheral contacting surface of improved configuration, and one particularly having an arcuate inner edge.

Another object of this invention is to provide a new process for the manufacture of such an improved tool wherein the process is relatively easy to accomplish and relatively inexpensive to perform.

SUMMARY OF THE INVENTION

To accomplish the foregoing and other objects of this invention there is provided a tool for positioning and bonding a semi-conductor wafer which generally comprises an upper portion adapted to be connected to a holder, and a lower portion terminating in a tip. The lower portion has means defining a peripheral wall forming a recess in the tip for accommodating the semi-conductor wafer. The improved configuration of the tool resides primarily in the peripheral beam lead contacting surface of the wall which is defined by an arcuate inner edge. This inner edge may be in the form of a radius or may be in a hyperbolic or parabolic curvature.

In accordance with the present invention there is also disclosed hereinafter a process of forming this arcuate inner edge on the peripheral wall, which process includes the steps of polishing or grinding the beam lead contacting surface of the wall to a flatness, and lapping the surface against an abrasive formed at least in part by a yieldable resilient material. The lapping is preferably accomplished by means of a vibratory lapping machine wherein the tool is maintained substantially stationary or possibly slightly moveable and the yieldable resilient material, which may be in the form of a chamois, is properly supported for oscillatory or vibratory motion.

DESCRIPTION OF THE DRAWINGS

Numerous other objects, features and advantages of the invention will now become apparent upon a reading of the following detailed description taken in conjunction with the accompanying drawings, in which.

DETAILED DESCRIPTION

Figure 1:
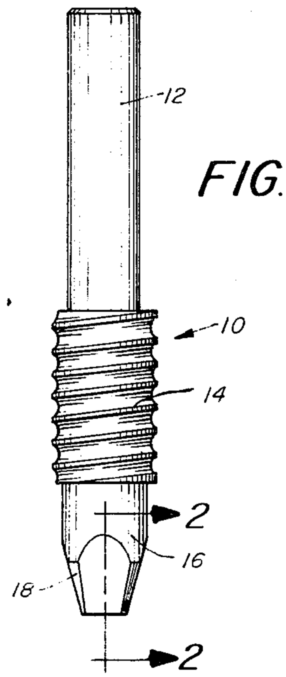
FIG. 1 shows a beam lead bonding tool.
Figure 2:
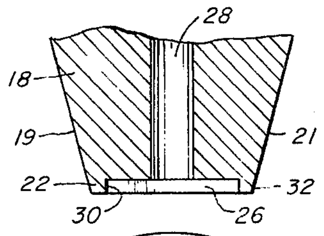
FIG. 2 is a cross-sectional view taken along line 2—2 of FIG. 1.
Figure 3:
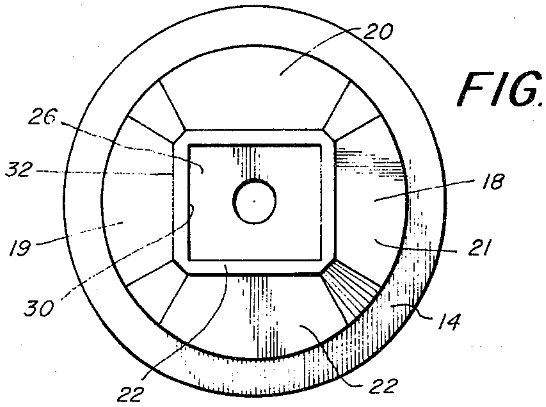
FIG. 3 is a bottom view of the tool shown in FIG. 1.

FIGS. 1–3 show a beam lead bonding tool 10 which may be constructed of titanium carbide, for example.

Figure 7:
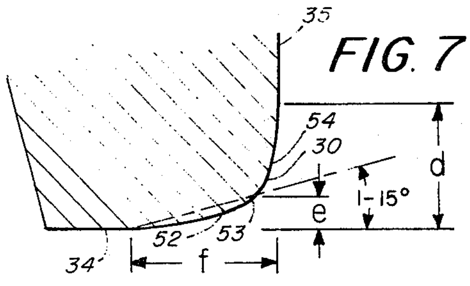
FIG. 7 is an enlarged view of the cross-section shown in FIG. 6.
Figure 6:
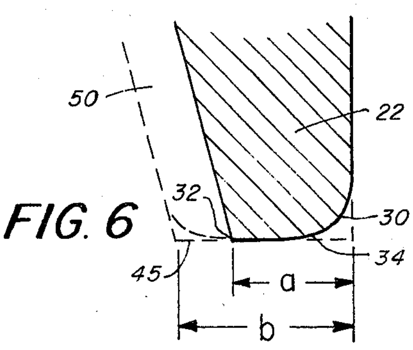
FIG. 6 is an enlarged cross-sectional view at a portion of the tip of the bonding tool and showing the configuration of the beam lead contacting surface.

FIGS. 1–3 show the general details of the tool and the beam lead contacting surface is shown more clearly in FIGS. 6 and 7.

The tool 10 includes an upper portion 12 which may be inserted in a conventional holder that may form a part of a semi-conductor bonding apparatus. The tool shown in the drawings is also useable with various other types of semi-conductor bonding apparatus. The tool shown in FIG. 1 also comprises a coiled heater section 14 and a lower portion 16 terminating in a tip 18. The tip 18 is formed by downwardly converging walls 19, 20, 21 and 22 which in part define peripheral wall 22 which is shown in FIG. 3 as being composed of four equal length wall sections which together form a square cavity 26. The wall sections may also define a rectangular or circular cavity. As indicated in FIG. 2 a suction duct 28 extends downwardly through the tool and terminates at its bottom end in cavity 26. A suction means not shown in the drawings is coupled to the top end of duct 28 and is operable for retaining a wafer in the recess 26.

In FIGS. 2 and 3 the peripheral wall 22 is shown as being defined by an inner edge 30 and outer edge 32. The shape of beam lead contacting surface 34 (See FIG. 6) and the exact configuration at edge 30 is discussed in more detail herein, after a consideration of the process of the present invention.

Figure 4:
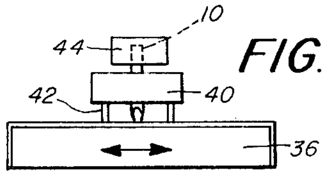
FIG. 4 shows the lapping machine used in the process of manufacture of the tool of the present invention.
Figure 5:
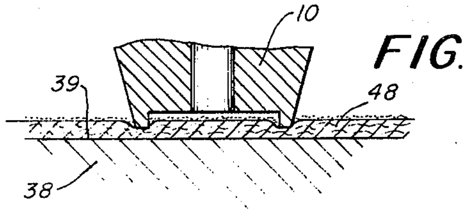
FIG. 5 is an enlarged cross-sectional view showing the lapping operation in accordance with the process of the present invention.

Referring now to FIG. 4, there is shown diagramatically a vibratory lapping machine 36 which is of conventional design including an oscillating plate 38 shown in FIG. 5 and which may be circular in shape. The machine 36 includes suitable oscillatory drive means and may be a lapping machine of a type sold by Star Diamond Industries. FIG. 4 also shows a jig 40 for holding the bonding tool 10. The jig 40 may include three or four legs 42 for supporting the jig a fixed distance above the top surface 39 of member 38. In order to bias the tool 10 toward the surface 39 there is provided a weight block 44 disposed over the top end of tool 10.

The block 44 may be constructed of brass or another metal and the member 38 may be formed of formica, for example.

In accordance with the process of the present invention the machine 36 is caused to vibrate and the jig 40 holding the tool 10 is permitted to move about the surface 39. A diamond paste is deposited on the surface 39 in accordance with the first step of the process. This diamond paste may be of the type sold by Elgin Diamond Products and include particles of one micron size. This diamond paste is conventionally available and consists of powdered diamond mixed in paste suspension. The purpose of this first step of the process is to provide a flat surface as indicated by reference character 45 which refers to the dotted flat line depicting the flat surface provided by this step of the process.

After the surface has been lapped or polished to a flat smoothness, which may take approximately five minutes, a chamois 48 or other resilient cloth is secured to surface 39 of the lapping machine. FIG. 5 shows this step of the process wherein the tool 10 is held against the chamois 48. A diamond paste is used in conjunction with the chamois. This diamond paste may contain diamond powder having particles of 3 micron size.

In place of the chamois one could also use velvet, nylon, leather or other materials that would provide a yielding relatively soft surface. Again, in this step of the process the tool will move relative to the chamois and due to the resiliency of the chamois a lapping of the surface 34 occurs thereby providing an arcuate inner edge 30. It is noted in FIG. 5 that this curvature is provided primarily by means of a resilient chamois or a like cloth which extends upwardly into the recess 26 and also up along the outer edges of the peripheral wall.

In FIG. 6 there is shown the cross section of the peripheral wall after the lapping operation for providing the arcuate edge 30 and also after the segment 50 of the wall has been ground away to provide the sharp edge 32. Previous to the removal of segment 50 the peripheral wall also had an outer arcuate edge that is substantially the mirror image of edge 30. Accordingly, the third basic step of the process is the grinding away of segment 50 to provide a slanted wall that terminates at sharp edge 32. In FIG. 6 the dimension *a* may typically be in the range of 3–8 mils. The dimension *b* may typically be around 12 mils.

Because the bonding tool is quite small and at its tip is on the order of 1/16 inch wide, it has been somewhat difficult to observe the exact configuration of the arcuate edge 30. The arcuate curvature is not a perfect radius but appears to assymptotically approach the beam lead contacting surface 34 and the upright surface 35 which in part forms the recess 26. The shape appears to be more of a hyperbolic shape and the curvature may be considered as comprising a relatively straight-lined section 52 which may be slanted on the order of 1–15 degrees and a second substantially straight-lined section 54. These sections may be considered as joined at point 53. The dimensions *e* and *f* in FIG. 7 are respectively 1 and 5 mils in a typical configuration. The dimension *d* may also be on the order of 5 mils. This dimension represents the height to which the lapping occurs within recess 26. Therefore, the dimension *d* is a function of the pressure applied by the block 44 and also the thickness of the nap of the chamois or other resilient pad.

Although the curvature is not believed to be a radius curvature, it can be approximated by one. It has been found that when this curvature, which may be represented by the dimension *e* in FIG. 7, is greater than 0.3 mils improved results are obtained. Preferably *e* is about 1 mil.

The arcuate edge 30 may also be approximated by a hyperbola wherein surfaces 34 and 35 correspond to the X and Y axis and the representative equation is XY=constant, wherein the constant is small or even less than one because the curvature is small.

Figure 8:
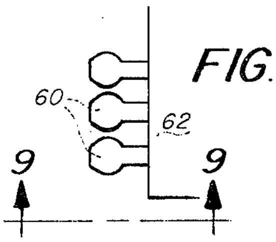
FIG. 8 is a plan view of a section of a wafer wherein the beam leads are bonded using a conventional tool.
Figure 9:
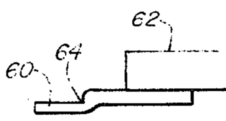
FIG. 9 is a cross-sectional view taken along line 9—9 of FIG. 8.

FIGS. 8 and 9 show the configuration of the beam leads 60 attached to a wafer 62 when a conventional prior art tool is used. It can be seen in FIG. 9 in particular that weakened area 64 occurs due to the sharpness of the inner edge of these prior art tools. Also, there is a bulging effect shown most clearly in FIG. 8 which may be a problem in that it is easier to cause contacting from one beam lead to its adjacent beam lead.

Figure 10:
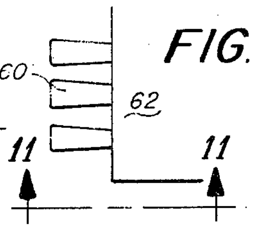
FIG. 10 is a plan view of a wafer wherein the beam leads have been bonded using the tool of the present invention.
Figure 11:
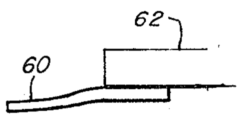
FIG. 11 is a cross-sectional view taken along line 11—11 of FIG. 10.

FIGS. 10 and 11 show diagrams similar to those shown in FIG. 8 and 9 but using a tool of the present invention. It is noted in FIG. 10 that the beam leads 60 do not bulge as much and thus there is less chance of short circuits therebetween. FIG. 11, even more importantly, shows that there is no weakened area such as the area 64 shown in FIG. 9. It is believed that this is due almost totally to the improved configuration of the beam lead contacting surface 34 including the arcuate edge 30.

One of the advantages of the present invention is that the process that is employed is quite simple and yet is effective in providing the desired configuration of the beam lead contacting surface. Another advantage of the present invention is that this process automatically provides the desired curvature along the entire edge of peripheral wall 22.

In accordance with another aspect of the present invention, instead of the need for finally grinding away the segment 50 shown in FIG. 6, a protective coating such as shellac could be applied along surfaces 19, 20, 21 and 22 to prevent lapping thereof. Right after the edge 30 has been lapped then a solvent could be used to remove the shellac from the other portions of the tip. This method is particularly advantageous when refinishing or reworking used tools.

Although this invention has been described in considerable detail, such a description is intended as being illustrative rather than limiting since the invention may be variously embodied without departing from its spirit and the scope of the invention is to be determined as claimed.

What is claimed is:

1. A tool for positioning and bonding a beam lead semiconductor wafer comprising;

an upper portion adapted to be connected to a holder, and a lower portion terminating in a tip, said lower portion having means defining a peripheral wall having a lower contacting surface and forming a recess in the tip for accommodating the semiconductor wafer, said wall defining an arcuate inner edge, said peripheral wall beind defined at least in part by an inner wall surface defining the recess, said inner edge approximating a curvature of greater than 0.3 mils and formed to assymptotically approach said inner wall surface and said lower contacting surface, wherein the form of the inner edge is controlled by the equation $c=(f)$ PK where $p=$ applied pressure, $c=$ curvature of arcuate inner edge and $K=$ thickness of nap of chamois.

2. The tool of claim 1 wherein said arcuate inner edge has at least two segments, an inner segment that approximates a straight line segment at a small angle to said inner wall surface, and an outer segment that approximates a straight line segment at a small angle to said lower contacting surface.

3. The tool of claim 2 wherein said outer segment is at approximately 1°–15° to said lower contacting surface.

4. The tool of claim 3 wherein said inner and outer segments are joined at a point, the distance, in the direction of said inner wall surface, from said point to said lower contacting surface being less than the distance, in the direction of said lower contacting surface, from said inner wall surface to a spot where said outer segment joins said lower contacting surface.

5. The tool of claim 4 wherein the distance, in the direction of said inner wall surface, from said point to a spot where said inner segment joins said inner wall surface is greater than the distance, in the direction of said inner wall surface, from said point to said lower contacting surface.

6. The tool of claim 5 wherein the distance in the direction of said inner wall surface from said lower contacting surface to a spot where said inner segment joins said inner wall surface is on the order of 5 mils.

7. The tool of claim 6 wherein the distance in the direction of said inner wall surface from said point to said lower contacting surface is on the order of 1 mil and the distance in the direction of said lower contacting surface from said inner wall surface to a spot where said outer segment joins said lower contacting surface is on the order of 5 mils.

8. The tool of claim 1 wherein said inner edge is hyperbolic in shape and governed by the equation $XY=\lambda$ constant where the constant is small.

9. The tool of claim 8 wherein the constant is less than one.

10. The tool of claim 1 wherein said peripheral wall also defines an outer edge that is sharper than said inner edge.

11. The tool of claim 1 wherein said curvature is hyperbolic.

12. The tool of claim 1 wherein said curvature is on the order of 1 mil.

13. A tool for positioning and bonding a beam lead device comprising;

an upper portion adapted to be connected to a holder, and a lower portion terminating in a tip, said lower portion having means defining a peripheral wall having a lower contacting surface and forming a recess in the tip for accommodating the device, said wall defining an arcuate inner edge, said peripheral wall being defined at least in part by an inner wall surface forming the recess, said inner edge approximating a curvature of greater than 0.3 mils and formed to assymptotically approach said inner wall surface and said lower contacting surface, wherein the form of the inner edge is controlled by the equation:

$$c = PK$$

where

P = applied pressure, $c$ = curvature of arcuate inner edge, and K = thickness of nap of chamois.

* * * * *